US007728600B2

(12) United States Patent
Wahlroos et al.

(10) Patent No.: US 7,728,600 B2
(45) Date of Patent: Jun. 1, 2010

(54) SYSTEM AND METHOD FOR DETERMINING LOCATION OF PHASE-TO-EARTH FAULT

(75) Inventors: Ari Wahlroos, Vaasa (FI); Janne Altonen, Toijala (FI)

(73) Assignee: ABB Technology AG, Zurich (CH)

( * ) Notice: Subject to any disclaimer, the term of this patent is extended or adjusted under 35 U.S.C. 154(b) by 192 days.

(21) Appl. No.: 12/003,621

(22) Filed: Dec. 28, 2007

(65) Prior Publication Data

US 2008/0174316 A1 Jul. 24, 2008

(30) Foreign Application Priority Data

Dec. 29, 2006 (EP) ................................. 06127343

(51) Int. Cl.
*G01R 31/00* (2006.01)
*H02H 5/04* (2006.01)
(52) U.S. Cl. ..................... 324/509; 324/500; 361/23
(58) Field of Classification Search ......... 324/500–557; 361/23
See application file for complete search history.

(56) References Cited

U.S. PATENT DOCUMENTS

| 4,996,624 | A | * | 2/1991 | Schweitzer, III | ............. 361/63 |
| 6,373,670 | B1 | * | 4/2002 | Bo | .............................. 361/81 |
| 6,661,630 | B1 | * | 12/2003 | Ahn | ............................. 361/80 |

FOREIGN PATENT DOCUMENTS

| EP | 0 069 790 A | 1/1983 |
| EP | 1 065 510 A | 1/2001 |
| EP | 1 304 580 A | 4/2003 |
| EP | 1 304 580 A2 | 4/2003 |
| EP | 1 724 597 A | 11/2006 |
| WO | WO 97/08562 A | 3/1997 |
| WO | WO 2004/003578 A | 1/2004 |

OTHER PUBLICATIONS

European Search Report dated Jun. 26, 2007.
Yao Zhang et al: "Transmission Line Fault Location for Double Phase-to Earth Fault on Non-Direct-Ground Neutral System" IEEE Transactions on Power Delivery, IEEE Service Center, New York, NY, US, vol. 15, No. 2, Apr. 2000 XP011049864.
Borghetti et al: "On the use of continuous-wavelet transform for fault location in distribution power systems" International Journal of Electrical Power & Energy Systems, Jordan Hill, Oxford, GB, vol. 28, No. 9, Nov. 2006 pp. 608-617 XP005665891.

(Continued)

*Primary Examiner*—Timothy J Dole
*Assistant Examiner*—Farhana Hoque
(74) *Attorney, Agent, or Firm*—Buchanan Ingersoll & Rooney PC

(57) ABSTRACT

A method, system and apparatus for determining a distance of a phase-to-earth fault on a three-phase electric line (30), the apparatus (40) being configured to determine a first estimate value for a distance between the measuring point (40) and a point of fault (F) on the basis of a first equation based on a fault loop model of the electric line, in which model the load of the electric line is located between the measuring point and the point of fault; determine a second estimate value for the distance on the basis of a second equation based on a fault loop model of the electric line, in which model the point of fault is located between the measuring point and load of the electric line; and select, according to predetermined criteria, one of the determined two estimate values as the distance between the measuring point and the point of fault.

23 Claims, 3 Drawing Sheets

OTHER PUBLICATIONS

Hanninen S et al: "Earth fault distance computation with artificial neural network trained y neutral voltage transients" 2001 IEEE Power Engineering Society. Summer Meeting. Conference Proceedings. Vancouver, Canada, Jul. 15-19, 2001, IEEE Power Engineering Society, New Yok, NY: IEEE, US vol. vol. 2 of 3, Jul. 15, 2001 pp. 1187-1192 XP010567909.

Hanninen et al: "Earth faults and related disturbances in distribution networks" IEE Proceedings: Geeration, Transmissiion and Distribution, Institution of Electrical Engineers, GB, vol. 149, No. 3, May 13, 2002, pp. 283-288 XP006018116.

Lehtonen M et al: "An automatic fault management model for distribution networks" Energy Management and Power Delivery, 1998. Proceedings of EMPD '98. 1998 International Conference on Singapore 3-5, March 1998, New York, NY, USA, IEEE, US, vol. 2, 3, pp. 645-649 P010293735.

Zhang Qingchao et al: "Transmission Line Fault Location for Single-Phase-to-earth Fault On Non-direct-ground Neutral system", IEEE Tranactions on Power Delivery, IEEE Service Center, New York, NY, US, vol. 13, No. 4, Oct. 1998, pp. 1086-1092 XP011049617.

* cited by examiner

SYSTEM AND METHOD FOR DETERMINING LOCATION OF PHASE-TO-EARTH FAULT

FIELD OF THE INVENTION

The present invention relates to localization of single-phase earth faults in electric networks.

BACKGROUND OF THE INVENTION

Localization of earth faults is a challenging task, especially in high impedance earthed networks. There are many factors which deteriorate the accuracy of a calculated fault location estimate, such as fault resistance and load. Distribution networks are especially challenging as they have specific features, which further complicate and challenge fault localization algorithms. These include e.g. non-homogeneity of lines, presence of laterals and load taps.

Impedance based fault location algorithms have become industry standard in modern microprocessor based protection relays. The reason of their popularity is their easy implementation as they utilize the same signals as the other functions. Their performance has proven to be satisfactory in localizing short-circuit faults, but they are often not capable of localizing low current earth faults, i.e. earth faults in high impedance earthed systems. This is due to the fact that an earth fault in high impedance earthed networks differs fundamentally from a short circuit fault. Document: Earth fault distance computation with fundamental frequency signals based on measurements in substation supply bay; Seppo Hänninen, Matti Lehtonen; VTT Research Notes 2153; Espoo 2002, discloses an example of a prior art method for fault localization of single phase earth faults in unearthed, Petersen coil compensated and low-resistance grounded networks. Document EP1304580 discloses a method for calculating the fault point distance to a single-pole earth fault within an electric power network compensated with a Petersen coil.

One important factor affecting the accuracy of impedance based fault localization algorithms is the combined effect of load current and fault resistance. A majority of prior art fault localization algorithms eliminate the load component from measured currents. Typically delta quantities (fault state value minus healthy state value), symmetrical components or a combination of both are used for this. Delta quantities can also be difference values due to e.g. variation of the Petersen coil compensation degree. This has the additional advantage that any systematic measurement errors are eliminated.

Prior art fault localization algorithms are typically based on an assumption that load is tapped to the end point of the electric line (e.g. feeder), i.e. the fault is always assumed to be located in front of the load point. In real medium voltage feeders this assumption is rarely correct. In fact, due to voltage drop considerations, loads are typically located either at the beginning of the feeder or distributed more or less randomly over the entire feeder length. In such cases, the accuracy of prior art fault localization algorithms is deteriorated.

In reality, the power systems are never perfectly balanced in terms of geometry and loading. If the phase-to-earth capacitances of individual phases are not equal, the system produces steady-state zero-sequence quantities. If the loading between phases is not equal, the system produces steady-state negative-sequence quantities. These steady-state sequence quantities are an additional error source for fault locator algorithms. Typically the effect of system steady-state unbalance is removed with use of delta quantities. Based on results obtained from simulations and field tests, this seems not to be a sufficient remedy at least for some algorithms. It is therefore important that the algorithm be designed and tested to be robust and stabile against system unbalance. Moreover, the application of prior art impedance based fault localization algorithms is usually restricted to effectively or low-impedance earthed systems. Therefore such algorithms cannot be applied in high-impedance earthed networks.

BRIEF DESCRIPTION OF THE INVENTION

An object of the present invention is thus to provide a method and an apparatus for implementing the method so as to overcome the above problems or at least to alleviate the problems. The objects of the invention are achieved by a method, a system, and a computer-readable storage medium which are characterized by what is stated in the independent claims. The preferred embodiments of the invention are disclosed in the dependent claims.

The invention is based on the idea of determining two possible fault location alternatives; one on the basis of a fault loop model in which the load of the electric line is located between the measuring point and the point of fault, and another on the basis of a fault loop model in which the point of fault is located between a measuring point and load of the electric line. Furthermore, voltage and current quantities in fault loop model equations are preferably optimally selected for fault localization purposes.

An advantage of the method and arrangement of the invention is that the accuracy of fault localization can be improved. The present invention is applicable in effectively and low-impedance earthed systems, but also in high impedance networks.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

The use of the method and system of the invention is not limited to any specific system, but they can be used in connection with various three-phase electric systems to determine a location of a phase-to-earth fault on a three-phase electric line of an electric network. The electric line can be a feeder, for example, and may be an overhead-line or a cable or a combination of both. The electric power system in which the invention is implemented can be an electric transmission or distribution network or a component thereof, for example, and may comprise several feeders. Moreover, the use of the invention is not limited to systems employing 50-Hz or 60-Hz fundamental frequencies or to any specific voltage level.

Figure 1:
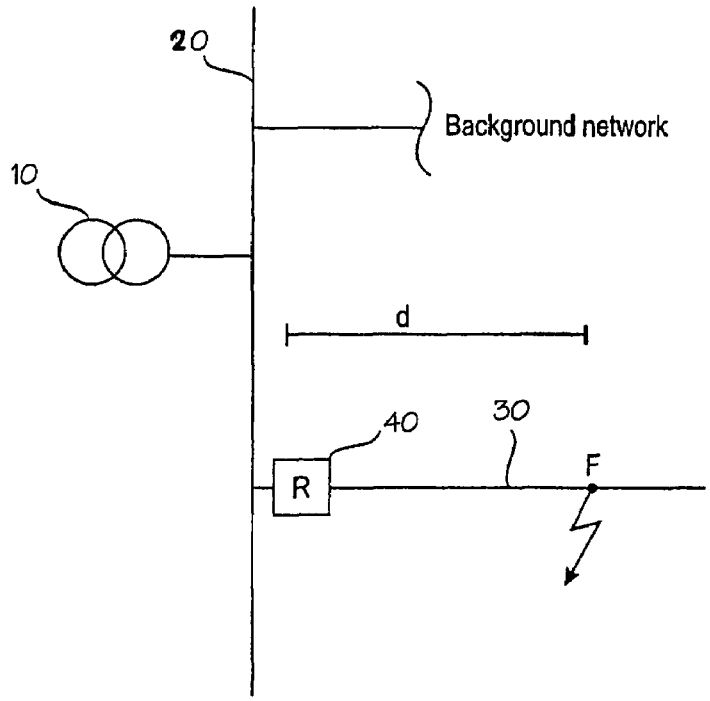
FIG. 1 is a diagram illustrating an electric network in which the invention can be used.

FIG. 1 is a simplified diagram illustrating an electric network in which the invention can be applied. The figure shows only the components necessary for understanding the invention. The exemplary network can be a medium voltage (e.g. 20 kV) distribution network fed through a substation comprising a transformer 10 and a busbar 20. The illustrated network also comprises electric line outlets, i.e. feeders, of which one 30 is shown separately. Other possible feeders as well as other network parts, except the line 30, are referred to as a 'background network'. The figure also shows a protective relay unit 40 at the beginning of line 30, and a point of earth fault F. The protective relay unit 40 may be located inside the substation. It should be noted that there may be any number of feeders or other network elements in the network. There may also be several feeding substations. Further, the invention can be utilized with a switching station without a transformer 10, for example. The network is a three-phase network although, for the sake of clarity, the phases are not shown in the figure. In the exemplary system of FIG. 1, the functionality of the invention is preferably located in the relay unit 40. It is also possible that only some measurements are performed at the location of unit 40 and the results are then transmitted to another unit or units in another location for further processing. In other words, unit 40 could be a mere measuring unit and the actual relay unit might be located apart from it.

In the following, the three phases of the three-phase electricity system in which the invention is used are referred to as L1, L2, and L3. The respective phase currents of phases L1, L2, and L3 are $I_{L1}$, $I_{L2}$, and $I_{L3}$ and the phase voltages are $U_{L1}$, $U_{L2}$, and $U_{L3}$. The monitored current and voltage values are preferably obtained by a suitable measuring arrangement including e.g. current and voltage transducers (not shown in the figures) connected to the phases of the electricity system. In most of the existing protection systems, these values are readily available and thus the implementation of the invention does not necessarily require any separate measuring arrangements. How these values are obtained is of no relevance to the basic idea of the invention and depends on the particular electricity system to be monitored. A phase-to-earth fault F on the three-phase electric line 30 and the corresponding faulted phase L1, L2, or L3 of the three-phase electric line of the electricity system to be monitored may be detected by e.g. a protective relay 40 associated with the electricity system. The particular way how the phase-to-earth fault is detected and the corresponding faulted phase is identified is of no relevance to the basic idea of the invention.

The invention is based on the idea of determining two alternative fault distance estimates from a measuring point (e.g. relay location 40 which may be e.g. in a substation) to a fault point F using fundamental frequency voltage and current signals and two alternative fault loop models. The models preferably differ from each other by how loading of the electric line is taken into account: one alternative model assumes that fault is located behind the load and another alternative model that the fault is located in front of the load. According to the invention, one of the determined two estimate values is then selected, according to predetermined criteria, as the distance between the measuring point and the point of fault. In the following some possible ways of determining the alternative fault distance estimates are given. However, it should be noted that the invention is not limited to the given exemplary equations or combinations thereof.

Figure 2:
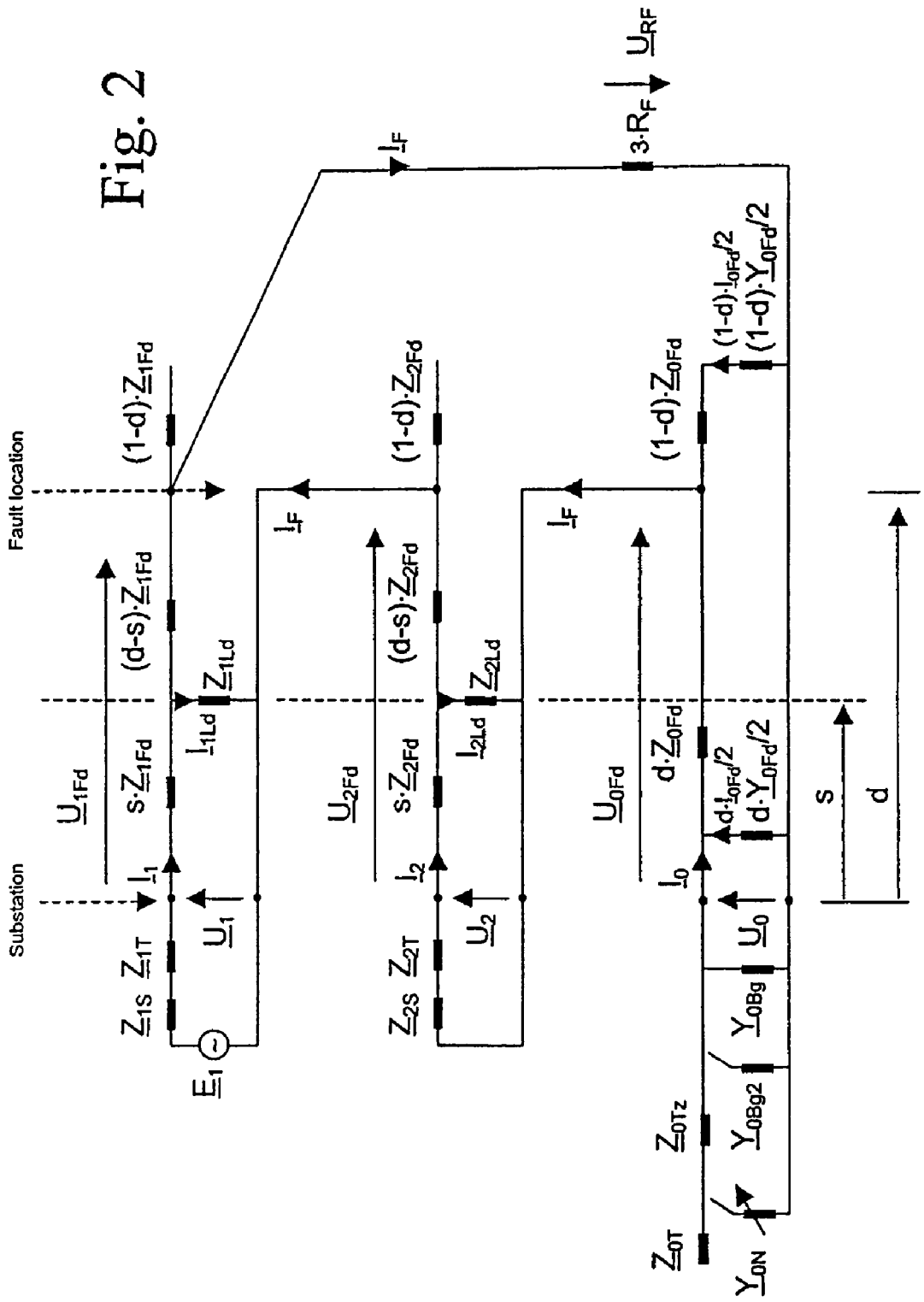
FIG. 2 is a symmetrical component equivalent scheme for single-phase earth fault on an electric line.

According to an embodiment of the invention, a first estimate value for the distance between the measuring point and a point of fault is determined on the basis of a first equation which is based on a fault loop model of the electric line, in which model the load of the electric line is located between the measuring point and the point of fault. FIG. 2 shows a symmetrical component equivalent scheme for a single-phase earth fault on an electric line in which the fault point is assumed to be behind the load tap. The measuring point in the illustrated example is assumed to be at the location of the substation.

Notations used in FIG. 2:

$\underline{Z}_{1S}$=Positive sequence source impedance
$\underline{Z}_{1T}$=Positive sequence impedance of the supply transformer.
d=per unit fault distance (d=0 . . . 1)
$\underline{Z}_{1Fd}$=Positive sequence impedance of the electric line per phase
$\underline{Z}_{1Ld}$=Positive sequence impedance of the load per phase
$\underline{Z}_{2S}$=Negative sequence source impedance
$\underline{Z}_{2T}$=Negative sequence impedance of the supply transformer
$\underline{Z}_{2Fd}$=Negative sequence impedance of the electric line per phase
$\underline{Z}_{2Ld}$=Negative sequence impedance of the load per phase
$\underline{Z}_{0T}$=Zero sequence impedance of the supply transformer (assumed to be delta connected)
$\underline{Z}_{0Tz}$=Zero sequence impedance of the grounding transformer
$\underline{Y}_{0Bg}$=Phase-to-earth admittance of the background network
$\underline{Y}_{0Bg2}$=Additional phase-to-earth admittance of the background network
$\underline{Y}_{0N}$=Admittance of the Petersen coil
$\underline{Z}_{0Fd}$=Zero sequence impedance of the electric line per phase
$\underline{Y}_{0Fd}$=Phase-to-earth admittance of the electric line
$R_F$=Fault resistance
$\underline{I}_1$=Positive sequence component current measured at the measuring point
$\underline{I}_{1Ld}$=Positive sequence component load current
$\underline{I}_F$=Fault component current at the fault point
$\underline{I}_2$=Negative sequence component current measured at the measuring point
$\underline{I}_{2Ld}$=Negative sequence component load current
$\underline{I}_0$=Zero sequence component current measured at the measuring point
$\underline{I}_{0Fd}$=Zero sequence component current of the electric line itself
$\underline{U}_1$=Positive sequence component voltage measured at the measuring point
$\underline{U}_2$=Negative sequence component voltage measured at the measuring point
$\underline{U}_0$=Zero sequence component voltage measured at the measuring point
s=per unit distance of equivalent load Based on the equivalent scheme illustrated in FIG. 2, the following equation can be written:

$$\underline{U}_0+\underline{U}_1+\underline{U}_2=s\cdot\underline{Z}_{1Fd}\cdot\underline{I}_1+(d-s)\cdot\underline{Z}_{1Fd}\cdot\underline{I}_F+s\cdot\underline{Z}_{2Fd}\cdot\underline{I}_2+(d-s)\cdot\underline{Z}_{2Fd}\cdot\underline{I}_F+d\cdot\underline{Z}_{0Fd}\cdot(\underline{I}_0+d\cdot\underline{I}_{0Fd}/2)+3\cdot\underline{Z}_F\cdot\underline{I}_F \qquad \text{eq1}$$

Alternatively, eq1 can be simplified by assuming that the term $d\cdot I_{0Fd}/2$ is not dependent on fault distance d. Then the following equation can be written:

$$\underline{U}_0+\underline{U}_1+\underline{U}_2=s\cdot\underline{Z}_{1Fd}\cdot\underline{I}_1+(d-s)\cdot\underline{Z}_{1Fd}\cdot\underline{I}_F+s\cdot\underline{Z}_{2Fd}\cdot\underline{I}_2+(d-s)\cdot\underline{Z}_{2Fd}\cdot\underline{I}_F+d\cdot\underline{Z}_{0Fd}\cdot(\underline{I}_0+\underline{I}_{0Fd}/2)+3\cdot\underline{Z}_F\cdot\underline{I}_F \qquad \text{eq2}$$

For conductors applies $\underline{Z}_2=\underline{Z}_1$. A commonly accepted assumption is that fault impedance is purely resistive, i.e. $\underline{Z}_F=R_F+jX_F=R_F$. Otherwise, the ratio of settings $X_F/R_F$ should be known.

Unknowns d and $\underline{Z}_F$ can be solved from eq1 or eq2 by dividing it into real and imaginary components.

Fault distance d can be solved from eq1, which results in a second order polynomial. The solution gives two alternative fault location estimates d1 and d2:

$$\underline{A}=-im(\underline{I}_F)*re(\underline{Z}_{0Fd}*\underline{I}_{0Fd})+im(\underline{Z}_{0Fd}*\underline{I}_{0Fd})*re(\underline{I}_F)$$

$$\underline{B}=(-2*im(\underline{I_F})*re(\underline{Z_{0Fd}}\underline{I_0})+2*im(\underline{Z_{2Fd}}*\underline{I_F})*re$$
$$(\underline{I_F})-2*im(\underline{I_F})*re(\underline{Z_{2Fd}}*\underline{I_F})-2*im(\underline{I_F})*re(\underline{Z_{1Fd}}*$$
$$\underline{I_F})+2*im(\underline{Z_{1Fd}}*\underline{I_F})*re(\underline{I_F})+2*im(\underline{Z_{0Fd}}*\underline{I_0})*re(\underline{I_F}))$$

$$\underline{C}=2*im(\underline{I_F})*re(\underline{U_0})+2*im(\underline{I_F})*re(\underline{U_1})+2*im(\underline{I_F})*re$$
$$(\underline{U_2})-2*im(\underline{I_F})*s*re(\underline{Z_{1Fd}}*\underline{I_1})+2*s*im(\underline{Z_{2Fd}}*$$
$$\underline{I_2})*re(\underline{I_F})+2*im(\underline{I_F})*re(\underline{Z_{1Fd}}\underline{I_F})*s-2*im$$
$$(\underline{I_F})*s*re(\underline{Z_{2Fd}}*\underline{I_2})-2*im(\underline{U_0})*re(\underline{I_F})+2*im$$
$$(\underline{I_F})*re(\underline{Z_{2Fd}}*\underline{I_F})*s-2*im(\underline{U_2})*re(\underline{I_F})+2*s*im$$
$$(\underline{Z_{1Fd}}*\underline{I_1})*re(\underline{I_F})-2*im(\underline{Z_{2Fd}}*\underline{I_F})*s*re(\underline{I_F})-2*im$$
$$(\underline{U_1})*re(\underline{I_F})-2*im(\underline{Z_{1Fd}}*\underline{I_F})*s*re(\underline{I_F})$$

$$d1=(-\underline{B}+sqrt(\underline{B}*\underline{B}-4*\underline{A}*\underline{C}))/(2*\underline{A}) \quad \text{eq3a}$$

$$d2=(-\underline{B}-sqrt(\underline{B}*\underline{B}-4*\underline{A}*\underline{C}))/(2*\underline{A}) \quad \text{eq3b}$$

The valid first estimate value for fault distance d is d1 or d2 such that 0<d<1 (in practice some error margin may be needed).

Alternatively, the first estimate value for fault distance d can be solved from eq2, which results in a first order polynomial, eq4:

$$d=-2*(-1*im(\underline{I_F})*re(\underline{U_0})-1*im(\underline{I_F})*re(\underline{U_1})-1*im$$
$$(\underline{I_F})*re(\underline{U_2})+im(\underline{I_F})*s*re(\underline{Z_{1Fd}}*\underline{I_1})-1*s*im(\underline{Z_{2Fd}}*$$
$$\underline{I_2})*re(\underline{I_F})-1*im(\underline{I_F})*re(\underline{Z_{1Fd}}*\underline{I_F})*s+im(\underline{I_F})*s*re$$
$$(\underline{Z_{2Fd}}*\underline{I_2})+im(\underline{U_0})*re(\underline{I_F})-1*im(\underline{I_F})*re(\underline{Z_{2Fd}}*$$
$$\underline{I_F})*s+im(\underline{U_2})*re(\underline{I_F})-1*s*im(\underline{Z_{1Fd}}*\underline{I_F})*re$$
$$(\underline{I_F})+im(\underline{Z_{2Fd}}*\underline{I_F})*s*re(\underline{I_F})+im(\underline{U_1})*re(\underline{I_F})+im$$
$$(\underline{Z_{1Fd}}*\underline{I_F})*s*re(\underline{I_F}))/(2*im(\underline{I_F})*re(\underline{Z_{1Fd}}*\underline{I_F})+2*im$$
$$(\underline{I_F})*re(\underline{Z_{2Fd}}*\underline{I_F})+2*im(\underline{I_F})*re(\underline{Z_{0Fd}}*\underline{I_0})+im$$
$$(\underline{I_F})*re(\underline{Z_{0Fd}}*\underline{I_{0Fd}})-2*im(\underline{I_F})*im(\underline{Z_{1Fd}}*\underline{I_F})-2*re$$
$$(\underline{I_F})*im(\underline{Z_{2Fd}}*\underline{I_F})-2*im(\underline{Z_{0Fd}}*\underline{I_0})*re(\underline{I_F})-1*im$$
$$(\underline{Z_{0Fd}}*\underline{I_{0Fd}})*re(\underline{I_F}))$$

The solution of $R_F$ can be derived from eq1, but a simpler form of equation results from eq2 as the result is a first order polynomial: Eq5:

$$R_F=-1/3*(2*re(\underline{Z_{2Fd}}*\underline{I_F})*s*im(\underline{Z_{0Fd}}*\underline{I_0})+2*re(\underline{Z_{1Fd}}*$$
$$\underline{I_F})*s*im(\underline{Z_{0Fd}}*\underline{I_0})-2*s*re(\underline{Z_{2Fd}}*\underline{I_2})*im(\underline{Z_{1Fd}}*$$
$$\underline{I_1})-2*s*re(\underline{Z_{2Fd}}*\underline{I_2})*im(\underline{Z_{0Fd}}*\underline{I_0})+2*re(\underline{U_0})*im$$
$$((\underline{Z_{0Fd}}*\underline{I_0})-2*s*re(\underline{Z_{2Fd}}*\underline{I_2})*im(\underline{Z_{1Fd}}*\underline{I_F})-1*im$$
$$(\underline{Z_{0Fd}}*\underline{I_{0Fd}})*s*re(\underline{Z_{2Fd}}*\underline{I_2})+im(\underline{Z_{0Fd}}*\underline{I_{0Fd}})*re$$
$$(\underline{Z_{2Fd}}*\underline{I_F})*S+re(\underline{Z_{0Fd}}*\underline{I_{0Fd}})*s*im(\underline{Z_{2Fd}}*\underline{I_2})-1*re$$
$$(\underline{Z_{0Fd}}*\underline{I_{0Fd}})*im(\underline{Z_{1Fd}}*\underline{I_F})*s+re(\underline{Z_{0Fd}}*\underline{I_{0Fd}})*s*im$$
$$(\underline{Z_{1Fd}}*\underline{I_1})-1*re(\underline{Z_{0Fd}}*\underline{I_{0Fd}})*im(\underline{Z_{2Fd}}*\underline{I_F})*s-1*im$$
$$(\underline{Z_{0Fd}}*\underline{I_{0Fd}})*s*re(\underline{Z_{1Fd}}*\underline{I_1})+im(\underline{Z_{0Fd}}*\underline{I_{0Fd}})*re$$
$$(\underline{Z_{1Fd}}*\underline{I_F})*s+2*re(\underline{Z_{1Fd}}*\underline{I_F})*S*im(\underline{Z_{2Fd}}*\underline{I_2})+2*re$$
$$(\underline{Z_{1Fd}}*\underline{I_F})*s*im(\underline{Z_{1Fd}}*\underline{I_1})+2*re(\underline{Z_{2Fd}}*\underline{I_F})*s*im$$
$$(\underline{Z_{2Fd}}*\underline{I_2})+2*re(\underline{Z_{2Fd}}*\underline{I_F})*s*im(\underline{Z_{1Fd}}*\underline{I_1})+2*re$$
$$(\underline{Z_{0Fd}}*\underline{I_0})*s*im(\underline{Z_{2Fd}}*\underline{I_2})+2*re(\underline{Z_{0Fd}}*\underline{I_0})*s*im$$
$$(\underline{Z_{1Fd}}*\underline{I_1})-2*re(\underline{Z_{0Fd}}*\underline{I_0})*im(\underline{Z_{2Fd}}*\underline{I_F})*s-2*re$$
$$(\underline{Z_{2Fd}}*\underline{I_0})*im(\underline{Z_{1Fd}}*\underline{I_F})*s-2*re(\underline{Z_{1Fd}}*\underline{I_1})*im$$
$$(\underline{Z_{1Fd}}*\underline{I_F})-2*s*re(\underline{Z_{1Fd}}*\underline{I_1})*im(\underline{Z_{2Fd}}*\underline{I_F})-2*s*re$$
$$(\underline{Z_{1Fd}}*\underline{I_1})*im(\underline{Z_{0Fd}}*\underline{I_0})+2*re(\underline{U_0})*im(\underline{Z_{2Fd}}*$$
$$\underline{I_F})-1*re(\underline{Z_{0Fd}}*\underline{I_{0Fd}})*im(\underline{U_1})+im(\underline{Z_{0Fd}}*\underline{I_{0Fd}})*re$$
$$(\underline{U_1})+im(\underline{Z_{0Fd}}*\underline{I_{0Fd}})*re(\underline{U_0})+im(\underline{Z_{0Fd}}*\underline{I_{0Fd}})*re$$
$$(\underline{U_2})-1*re(\underline{Z_{0Fd}}*\underline{I_{0Fd}})*im(\underline{U_0})-1*re(\underline{Z_{0Fd}}*$$
$$\underline{I_{0Fd}})*im(\underline{U_2})+2*re(\underline{U_1})*im(\underline{Z_{1Fd}}*\underline{I_F})-2*re(\underline{Z_{1Fd}}*$$
$$\underline{I_F})*im(\underline{U_1})-2*re(\underline{Z_{2Fd}}*\underline{I_F})*im(\underline{U_2})-2*re(\underline{Z_{0Fd}}*$$
$$\underline{I_0})*im(\underline{U_0})-2*re(\underline{Z_{0Fd}}*\underline{I_0})*im(\underline{U_2})-2*re(\underline{Z_{0Fd}}*$$
$$\underline{I_0})*im(\underline{U_1})+2*re(\underline{U_0})*im(\underline{Z_{1Fd}}*\underline{I_F})+2*re(\underline{U_1})*im$$
$$(\underline{Z_{2Fd}}*\underline{I_F})+2*re(\underline{U_1})*im(\underline{Z_{0Fd}}*\underline{I_0})+2*re(\underline{U_2})*im$$
$$(\underline{Z_{1Fd}}*\underline{I_F})+2*re(\underline{U_2})*im(\underline{Z_{2Fd}}*\underline{I_F})+2*re(\underline{U_2})*im$$
$$(\underline{Z_{0Fd}}*\underline{I_0})-2*re(\underline{Z_{1Fd}}*\underline{I_F})*im(\underline{U_0})-2*re(\underline{Z_{2Fd}}*$$
$$\underline{I_F})*im(\underline{U_2})-2*re(\underline{Z_{2Fd}}*\underline{I_F})*im(\underline{U_0})-2*re(\underline{Z_{2Fd}}*$$
$$\underline{I_F})*im(\underline{U_1}))/(-2*im(\underline{Z_{1Fd}}*\underline{I_F})*re(\underline{I_F})-2*im(\underline{Z_{2Fd}}*$$
$$\underline{I_F})*re(\underline{I_F})-2*im(\underline{Z_{0Fd}}*\underline{I_0})*re(\underline{I_F})-1*im(\underline{Z_{0Fd}}*$$
$$\underline{I_{0Fd}})*re(\underline{I_F})+2*im(\underline{I_F})*re(\underline{Z_{1Fd}}*\underline{I_F})+2*im(\underline{I_F})*re$$
$$(\underline{Z_{2Fd}}*\underline{I_F})+2*im(\underline{I_F})*re(\underline{Z_{0Fd}}*\underline{I_0})+im(\underline{I_F})*re(\underline{Z_{0Fd}}*$$
$$\underline{I_{0Fd}}))$$

Figure 3:
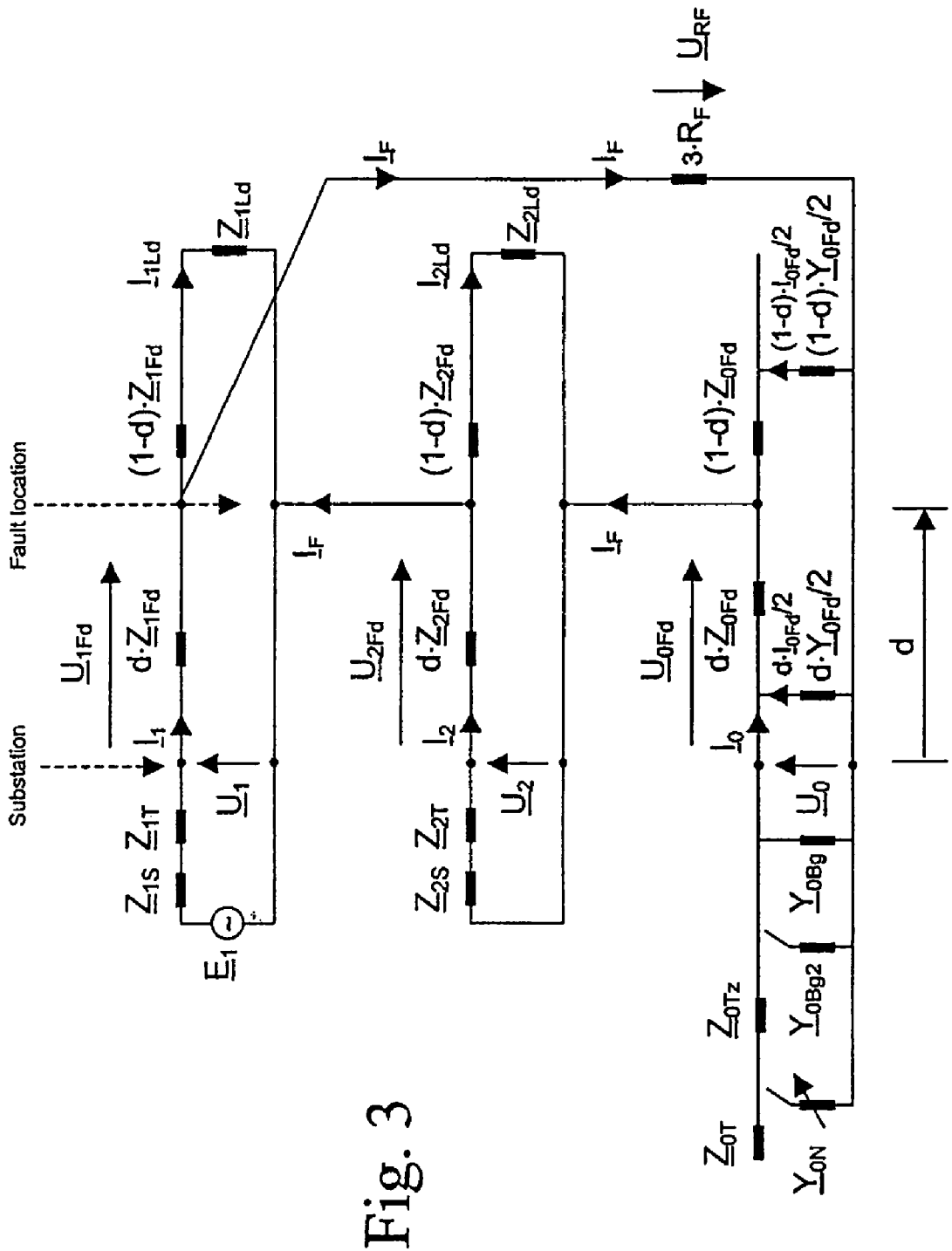
FIG. 3 is a symmetrical component equivalent scheme for single-phase earth fault on an electric line.

According to an embodiment of the invention, a second estimate value for the distance between the measuring point and a point of fault is determined on the basis of a second equation which is based on a fault loop model of the electric line, in which model the point of fault is located between the measuring point and load of the electric line. FIG. 3 shows a symmetrical component equivalent scheme for a single-phase earth fault on an electric line in which the fault point is assumed to be in front of the load tap. The measuring point in the illustrated example is assumed to be at the location of the substation. Based on an equivalent scheme illustrated in FIG. 3, the following equation can be written:

$$\underline{U_0}+\underline{U_1}+\underline{U_2}=d\cdot\underline{Z_{1Fd'}}\underline{I_1}+d\cdot\underline{Z_{2Fd'}}\underline{I_2}+d\cdot\underline{Z_{0Fd'}}(\underline{I_0}+d\cdot\underline{I_{0Fd}}/2)+3\cdot\underline{Z_F}\underline{I_F} \quad \text{eq6}$$

Alternatively, eq6 can be simplified by assuming that the term $d\cdot\underline{I_{0Fd}}/2$ is not dependent on fault distance d. Then the following equation can be written:

$$\underline{U_0}+\underline{U_1}+\underline{U_2}=d\cdot\underline{Z_{1Fd'}}\underline{I_1}+d\cdot\underline{Z_{2Fd'}}\underline{I_2}+d\cdot\underline{Z_{0Fd'}}(\underline{I_0}+\underline{I_{0Fd}}/2)+3\cdot\underline{Z_F}\underline{I_F} \quad \text{eq7}$$

Unknowns d and $\underline{Z_F}$ can be solved from eq6 or eq7 by use of the real and imaginary components.

Fault distance d can be solved from eq6, which results in a second order polynomial. The solution gives two alternative fault location estimates d1 and d2:

$$\underline{A}=im(\underline{I_F})*re(\underline{Z_{0Fd}}*\underline{I_{0Fd}})-im(\underline{Z_{0Fd}}*\underline{I0Fd})*re(\underline{I_F})$$

$$B=-2*im(\underline{Z_{1Fd}}*\underline{I_1})*re(\underline{I_F})+2*im(\underline{I_F})*re(\underline{Z_{1Fd}}*$$
$$\underline{I_1})+2*im(\underline{I_F})*re(\underline{Z_{2Fd}}*\underline{I_2})+2*im(\underline{I_F})*re(\underline{Z_{0Fd}}*$$
$$\underline{I_0})-2*im(\underline{Z_{2Fd}}*\underline{I_2})*re(\underline{I_F})-2*im(\underline{Z_{0Fd}}*\underline{I_0})*re(\underline{I_F})$$

$$C=-2*im(\underline{I_F})*re(\underline{U_0})-2*im(\underline{I_F})*re(\underline{U_1})-2*im(\underline{I_F})*re$$
$$(\underline{U_2})+2*im(\underline{U_0})*re(\underline{I_F})+2*im(\underline{U_1})*re(\underline{I_F})+2*im$$
$$(\underline{U_2})*re(\underline{I_F})$$

$$d1=(-\underline{B}+sqrt(\underline{B}*\underline{B}-4*\underline{A}*\underline{C}))/(2*\underline{A}) \quad \text{eq8a}$$

$$d2=(-\underline{B}-sqrt(\underline{B}*\underline{B}-4*\underline{A}*\underline{C}))/(2*\underline{A}) \quad \text{eq8b}$$

The valid second estimate value for fault distance d is d1 or d2 such that 0<d<1 (in practice some error margin may be needed).

Alternatively, the second estimate value for fault distance d can be solved from eq7, which results in a first order polynomial, eq9:

$$d=2*(im(\underline{I_F})*re(\underline{U_0})+im(\underline{I_F})*re(\underline{U_1})+im(\underline{I_F})*re$$
$$(\underline{U_2})-1*im(\underline{U_0})*re(\underline{I_F})-1*im(\underline{U_1})*re(\underline{I_F})-1*im$$
$$(\underline{U_2})*re(\underline{I_F}))/(2*im(\underline{I_F})*re(\underline{Z_{1Fd}}*\underline{I_1})+2*im(\underline{I_F})*re$$
$$(\underline{Z_{2Fd}}*\underline{I_2})+2*im(\underline{I_F})*re(\underline{Z_{0Fd}}*\underline{I_0})+im(\underline{I_F})*re$$
$$(\underline{Z_{0Fd}}*\underline{I_{0Fd}})-2*im(\underline{Z_{1Fd}}*\underline{I_1})*re(\underline{I_F})-2*im(\underline{Z_{2Fd}}*$$
$$\underline{I_2})*re(\underline{I_F})-2*im(\underline{Z_{0Fd}}*\underline{I_0})*re(\underline{I_F})-1*im(\underline{Z_{0Fd}}*$$
$$\underline{I_{0Fd}})*re(\underline{I_F}))$$

The solution of $R_F$ can be derived from eq6, but a simpler form of equation results from eq7 as the result is a first order polynomial: Eq10:

$$R_F=-1/3*(-2*im(\underline{U_1})*re(\underline{Z_{2Fd}}*\underline{I_2})-1*re(\underline{Z_{0Fd}}*$$
$$\underline{I_{0Fd}})*im(\underline{U_1})-2*im(\underline{U_2})*re(\underline{Z_{1Fd}}*\underline{I_1})-2*im$$
$$(\underline{U_2})*re(\underline{Z_{2Fd}}*\underline{I_2})-2*re(\underline{Z_{0Fd}}*\underline{I_0})*im(\underline{U_2})-1*re$$
$$(\underline{Z_{0Fd}}*\underline{I_{0Fd}})*im(\underline{U_2})-2*im(\underline{U_0})*re(\underline{Z_{2Fd}}*\underline{I_2})+2*im$$
$$(\underline{Z_{1Fd}}*\underline{I_1})*re(\underline{U_0})+2*im(\underline{Z_{1Fd}}*\underline{I_1})*re(\underline{U_1})+2*im$$
$$(\underline{Z_{1Fd}}*\underline{I_1})*re(\underline{U_2})+2*im(\underline{Z_{2Fd}}*\underline{I_2})*re(\underline{I_0})+2*im$$
$$(\underline{Z_{2Fd}}*\underline{I_2})*re(\underline{U_1})+2*im(\underline{Z_{2Fd}}*\underline{I_2})*re(\underline{U_2})+2*re$$
$$(\underline{U_0})*im(\underline{Z_{0Fd}}*\underline{I_0})+2*re(\underline{U_1})*im(\underline{Z_{0Fd}}*\underline{I_0})+2*re$$
$$(\underline{U_2})*im(\underline{Z_{0Fd}}*\underline{I_0})+im(\underline{Z_{0Fd}}*\underline{I_{0Fd}})*re(\underline{U_1})+im$$
$$(\underline{Z_{0Fd}}*\underline{I_{0Fd}})*re(\underline{U_2})-2*im(\underline{U_0})*re(\underline{Z_{1Fd}}*\underline{I_1})-2*re$$
$$(\underline{Z_{0Fd}}*\underline{I_0})*im(\underline{U_0})-2*im(\underline{U_1})*re(\underline{Z_{1Fd}}*\underline{I_1})-1*re$$
$$(\underline{Z_{0Fd}}*\underline{I_{0Fd}})*im(\underline{U_0})+im(\underline{Z_{0Fd}}*\underline{I_{0Fd}})*re(\underline{U_0})-2*re$$
$$(\underline{Z_{0Fd}}*\underline{I_0})*im(\underline{U_1}))/(2*im(\underline{I_F})*re(\underline{Z_{1Fd}}*\underline{I_1})+2*im$$
$$(\underline{I_F})*re(\underline{Z_{2Fd}}*\underline{I_2})+2*im(\underline{I_F})*re(\underline{Z_{0Fd}}*\underline{I_0})+im(\underline{I_F})*re$$
$$(\underline{Z_{0Fd}}*\underline{I_{0Fd}})-2*im(Z_{1Fd}*\underline{I_1})*re(\underline{I_F})-2*im(\underline{Z_{2Fd}}*$$
$$\underline{I_2})*re(\underline{I_F})-2*im(\underline{Z_{0Fd}}*\underline{I_0})*re(\underline{I_F})-1*im(\underline{Z_{0Fd}}*$$
$$\underline{I_{0Fd}})*re(\underline{I_F}))$$

According to an embodiment of the invention, current and voltage variables are preferably selected as follows:

$\underline{U_1}$=positive sequence voltage component=$(\underline{U_{L1}}+a\cdot\underline{U_{L2}}+a^2\cdot U_{L3})/3$ $\underline{U}_2$=negative sequence voltage component=$(\underline{U}_{L1}+a^2\cdot\underline{U}_{L2}+a\cdot\underline{U}_{L3})/3$
$\underline{U}_0$=zero sequence voltage component=$(\underline{U}_{L1}+\underline{U}_{L2}+\underline{U}_{L3})/3$
$\underline{I}_1$=positive sequence current component=$(\underline{I}_{L1}+a\cdot\underline{I}_{L2}+a^2\cdot\underline{I}_{L3})/3$
$\underline{I}_2$=negative sequence current component=$(\underline{I}_{L1}+a^2\cdot\underline{I}_{L2}+a\cdot\underline{I}_{L3})/3$
$\underline{I}_0$=zero sequence current component=$(\underline{I}_{L1}+\underline{I}_{L2}+\underline{I}_{L3})/3$
$\underline{I}_F$=$3\underline{2}\underline{K}_1\cdot\underline{I}_0$ or alternatively $\underline{I}_F=\underline{I}_2$
$\underline{I}_{0Fd}=(\underline{K}_1-1)\cdot\underline{I}_0$ or alternatively $\underline{I}_{0Fd}=(\underline{I}_2-\underline{I}_0)$
where
$a=\cos(120°)+j\cdot\sin(120°)$
$\underline{K}_1$=current distribution factor.

According to embodiments of the invention, there are two alternative principles of calculating the fault distance using equations eq3a, eq3b and eq8a, eq8b or eq4 and eq9.

According to the first alternative principle, the fault distance may be calculated based on voltage and current values before and after a change during an earth fault. The change can be due to switching on or off an additional resistance parallel with the Petersen coil, changing the compensation degree of the Petersen coil, or it could be due to switching operation of the background network during the fault, which either reduces or increases the fault current. In this case, the voltages and currents are preferably selected as follows:

$\underline{U}_1=\Delta\underline{U}_1$ $\underline{U}_2=\Delta\underline{U}_2$ $\underline{U}_0=\Delta\underline{U}_0$ $\underline{I}_1=\Delta\underline{I}_1$ $\underline{I}_2=\Delta\underline{I}_2$ $\underline{I}_0=\Delta\underline{I}_0$ $\underline{I}_F=\Delta\underline{I}_F$ $\underline{I}_{0Fd}=\Delta\underline{I}_{0Fd}$ where $\Delta$=pre-change value−post-change value.

This alternative has the benefit that the influence of load current is practically totally eliminated. Also influence of system and load asymmetry is eliminated. Furthermore, any systematic measurement errors are eliminated. The drawback is that a change condition is needed during an earth fault.

According to the second alternative principle, the fault distance may be calculated based on pre-fault and fault values of voltages and currents. In this case, the voltages and currents are preferably selected as follows:

$\underline{U}_1=\underline{U}_1$ $\underline{U}_2=\underline{U}_2$ $\underline{U}_0=\underline{U}_0$ $\underline{I}_1=\underline{I}_1$ $\underline{I}_2=\Delta\underline{I}_2$ $\underline{I}_0=\Delta\underline{I}_0$ $\underline{I}_F=\Delta\underline{I}_F$ $\underline{I}_{0Fd}=\Delta\underline{I}_{0Fd}$ where $\Delta$=pre-fault value−fault value.

As steady-state asymmetry in the zero sequence current is typically negligible, delta quantity is not absolutely required with zero sequence current. Also the negative sequence current quantity could be calculated without delta quantity, especially if steady-state negative sequence current is small (i.e. load is not greatly unbalanced). Thus, quantities $\Delta\underline{I}_0$ and/or $\Delta\underline{I}_2$ could be replaced with $\underline{I}_0$ and/or $\underline{I}_2$, respectively.

This alternative has the benefit that no change is needed during an earth fault. Also influence of system and load asymmetry is eliminated. The drawback is that accurate results require that fault current exceeds the load current value. A sufficient fault current magnitude could be achieved also in case of a cross-country fault, where two single phase earth faults occur simultaneously at different feeders and different phases. Such a fault could also be created artificially by first determining the faulted phase during a single-phase earth fault and then creating another earth fault on another phase and another feeder in the substation. The duration of the double earth fault can be very short, a few cycles is enough for fault distance calculation.

The previous equations assumed an earth fault condition in phase L1. If the fault occurs in phase L2 or L3, the positive and negative sequence components should be phase adjusted. This can be done based on the well-known theory of symmetrical components. Taken phase L1 as preference:

L1: $\underline{U}_2=\underline{U}_2$ $\underline{I}_2=\underline{I}_2$ $\underline{U}_1=\underline{U}_1$ $\underline{I}_1=\underline{I}_1$
L2: $\underline{U}_2=a\cdot\underline{U}_2$ $\underline{I}_2=a\cdot\underline{I}_2$ $\underline{U}_1=a^2\cdot U_1$ $\underline{I}_1=a^2\cdot I_1$
L3: $\underline{U}_2=a^2\cdot\underline{U}_2$ $\underline{I}_2=a^2\cdot\underline{I}_2$ $\underline{U}_1=a\cdot U_1$ $\underline{I}_1=a\cdot I_1$ According to an embodiment of the invention, the current distribution factor $\underline{K}_1$ can be calculated with the following equation:

$$K_1 = \frac{Y_{0F}+Y_{0BG}}{Y_{0BG}} = \frac{Y_{0TOT}}{Y_{0BG}} \qquad \text{eq11}$$

where $\underline{Y}_{0F}$=Apparent zero-sequence admittance of the electric line $\underline{Y}_{0BG}$=Apparent zero-sequence admittance of the background network.

$\underline{Y}_{0F}$ can be determined by using predetermined conductor data:

$$Y_{0F} = \frac{1}{R_{L0F}} + j\cdot\omega\cdot C_{0F} = \frac{1}{R_{L0F}} + j\cdot\frac{1}{X_{C0F}}, \qquad \text{eq12}$$

where $R_{L0F}$=Resistance representing the leakage losses of the electric line $X_{C0F}$=Phase-to-earth capacitive reactance of the electric line Parameter $X_{C0F}$ can be calculated based on phase-to-earth capacitances of the protected feeder:

$$X_{C0F} = \frac{1}{j\cdot\omega\cdot C_{0F}},$$

where $C_{0F}$=total phase-to-earth capacitance per phase of the protected feeder.

If the magnitude of the earth fault current of the electric line $I_{ef}$ is known, the corresponding earth capacitance per phase can be calculated using equation:

$$C_{0F} = \frac{I_{ef}}{3 \cdot \omega \cdot U_V},$$

where $U_v$=magnitude of phase-to-ground voltage

The exact value for parameter $R_{L0F}$ is typically unknown, but based on field recordings, an approximation of 10 . . . 30·$X_{C0F}$ can be used. As $\underline{Y}_{0F}$ is always dominantly capacitive, the knowledge of exact value for $R_{L0F}$ is not essential.

Alternatively, the value of $\underline{Y}0F$ can be determined by measurements:

$$\underline{Y}_{0F} = \frac{\Delta \underline{I}_0}{\Delta \underline{U}_0} \quad \text{eq13}$$

where
$\Delta \underline{I}_0 = (\underline{I}_{0fault} - \underline{I}_{prefault})$=delta quantity for a measured zero sequence current component at the measuring point
$\Delta \underline{U}_0 = (\underline{U}_{0fault} - \underline{U}_{prefault})$=delta quantity for a measured zero sequence voltage component at the measuring point The measurement of (eq13) can be conducted whenever an earth fault occurs outside the protected feeder. Note, however, that the calculated values match the current switching state of the feeder and thus if the switching state of the protected feeder changes, then the values are no longer valid. In this case, the measurement should preferably be repeated.

The value for $\underline{Y}_{0BG}$ can be determined by using the measured zero sequence quantities during a single-phase earth fault on the electric line:

$$\underline{Y}_{0BG} = -\frac{\Delta \underline{I}_0}{\Delta \underline{U}_0} \quad \text{eq14}$$

The value of $\underline{Y}_{0BG}$ describes the properties of the background network. The reactive part is proportional to the magnitude of fault current and the resistive part describes the magnitude of resistive leakage losses.

As steady-state asymmetry in zero sequence current is typically negligible, delta quantity is not absolutely required with zero sequence current in equations (eq13) and (eq14). However, the unbalance in phase-to-earth capacitances of individual phases creates steady-state zero-sequence voltage, which should be eliminated with use of delta quantities in high impedance earthed networks.

According to an embodiment of the invention, the loading of the electric line is taken into account by modelling it. The loading is preferably modelled with a fictitious load tap located at distance s [0 . . . 1 p.u.] from the measuring point. The parameter s represents this equivalent load distance, which can be determined either by means of calculations or by means of measurements in primary network.

In practice, the loading varies in time and place and thus the value of s is never totally constant. There is also a slight variation of s between phases, as loading of different phases is in practice never perfectly balanced. The determination of s is therefore preferably done in different loading scenarios, so that the variation of s can be evaluated. The value which represents the most typical loading condition should preferably be used as a value for s.

Figure 4:
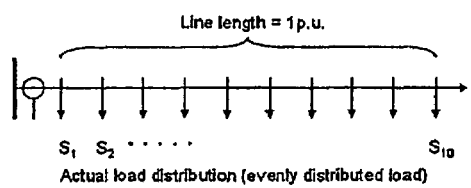
FIG. 4 illustrates derivation of equivalent load distance according to an embodiment of the invention.
Figure 4:
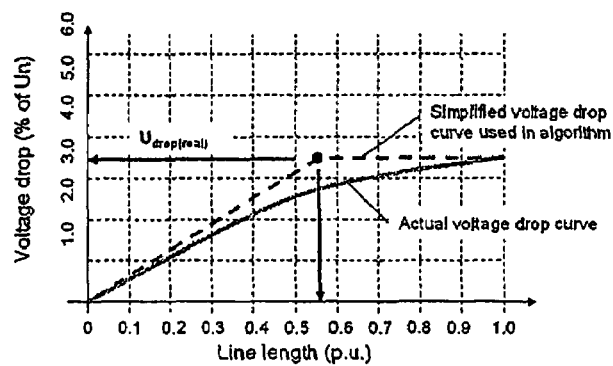
Figure 4:
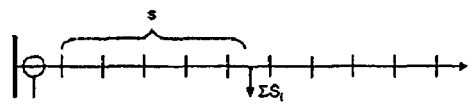

According to an embodiment of the invention, equivalent load distance s is determined by means of calculations. FIG. 4 further visualizes the derivation and meaning of parameter s. In the illustrated exemplary case, the load is assumed to be evenly distributed along the electric line. In FIG. 4, the solid curve shows the actual voltage drop. The maximum value of the voltage drop is experienced at the end of the line and it is denoted by $U_{drop(real)}$. Now, if the whole load of this line were concentrated as a single load tap and located at a distance s from the substation calculated from equation eq9, the resulting maximum voltage drop would equal the actual maximum voltage drop $U_{drop(real)}$. The dashed curve in FIG. 4 shows the voltage drop when the total load is located at distance s from the measuring point.

The calculation of the equivalent load distance (parameter s) can be based on calculating the resulting voltage drop along the line in two different loading conditions. The parameter s is the quotient of voltage drops in these two different loading conditions:

$$s = \frac{U_{drop(real)}}{U_{drop(s=1)}} \quad \text{eq15}$$

where
$U_{drop(real)}$=actual maximum voltage drop of the electric line
$U_{drop(s=1)}$=fictious voltage drop, if all load is tapped at the end of the electric line.

The actual maximum voltage drop, $U_{drop(real)}$, results with actual load distribution in the furthest point of a radial feeder. The value can be obtained from network calculation program, for example.

The fictious voltage drop, $U_{drop(s=1)}$, results when a load corresponding to the actual maximum voltage drop is tapped at a single point in the furthest point of the feeder. The voltage drop can be calculated with the following simple equation:

$$U_{drop(s=1)} = \frac{\text{abs}(\underline{Z}_1 \cdot \underline{S})}{U^2} \cdot 100\% \quad \text{eq16}$$

where
$\underline{Z}_1$=positive sequence impedance from the measuring point to the point, where the voltage drop is at its maximum
$\underline{S}$=Total apparent load of the electric line (=P+j·Q)
P=Real part of apparent load, real power
Q=Imaginary part of apparent load, reactive power
U=Nominal voltage at the measuring point (phase-to-phase)

In the following an example is given on how the equivalent load distance can be calculated: in the example the total load of the electric line is $\underline{S}$=1.430+j·0.265 MW (U=20.5 kV). The positive sequence impedance from the measuring point to the point, where the voltage drop is at its maximum, is: $\underline{Z}_1$=12.778+j·12.871 ohm. The corresponding maximum voltage drop obtained from a network calculation program is $U_{drop(real)}$=3.61%. The fictious voltage drop corresponding to the situation where the total load would be located in a single point at the end of the line can be calculated as follows:

$$U_{drop(s=1)} = \frac{\text{abs}(\underline{Z}_1 \cdot \underline{S})}{U^2} \cdot 100\% = 6.28\%$$

Using the equation (eq15), the equivalent load distance value is:

$$s = \frac{U_{drop(real)}}{U_{drop(s=1)}} = \frac{3.61\%}{6.28\%} = 0.5748$$

According to an embodiment of the invention, equivalent load distance s is determined by means of measurements. The measurement of parameter s can be conducted by making a single-phase earth fault ($R_F$=0 ohm) at the furthest point of the electric line (d=1), where the maximum actual voltage drop takes place. The parameter s can be calculated using equations eq1 or eq2 derived from equivalent scheme illustrated in FIG. 2. Unknown s (and $\underline{Z}_F$) can be solved from eq1 or eq2 by dividing it into real and imaginary components. The solution of s can be derived from eq1, but a simpler form of equation results from eq2 as the result is a first order polynomial: Eq17:

$$s = -0.5*(-2*im(\underline{I}_F)*re(\underline{U}_0)-2*im(\underline{I}_F)*re(\underline{U}_1)-2*im(\underline{I}_F)*re(\underline{U}_2)+2*im(\underline{U}_1)*re(\underline{I}_F)+2*im(\underline{I}_F)*re(\underline{Z}_{1Fd}*\underline{I}_F)-2*im(\underline{Z}_{1Fd}*\underline{I}_F)*re(\underline{I}_F)-2*im(\underline{Z}_{1Fd}*\underline{I}_F)*re(\underline{I}_F)+2*im(\underline{I}_F)*re(\underline{Z}_{2Fd}*\underline{I}_F)-1*im(\underline{Z}_{0Fd}*\underline{I}_{0Fd})*re(\underline{I}_F)+2*im(\underline{I}_F)*re(\underline{Z}_{0Fd}*\underline{I}_0)+im(\underline{I}_F)*re(\underline{Z}_{0Fd}*\underline{I}_{0Fd})+2*im(\underline{U}_0)*re(\underline{I}_F)-2*im(\underline{Z}_{0Fd}*\underline{I}_0)*re(\underline{I}_F)+2*im(\underline{U}_2)*re(\underline{I}_F))/(im(\underline{I}_F)*re(\underline{Z}_{1Fd}*\underline{I}_1)-1*im(\underline{Z}_{2Fd}*\underline{I}_2)*re(\underline{I}_F)-1*im(\underline{I}_F)*re(\underline{Z}_{1Fd}*\underline{I}_F)+im(\underline{I}_F)*re(\underline{Z}_{2Fd}*\underline{I}_2)-1*im(\underline{I}_F)*re(\underline{Z}_{2Fd}*\underline{I}_F)-1*im(\underline{Z}_{1Fd}*\underline{I}_1)*re(\underline{I}_F)+im(\underline{Z}_{2Fd}*\underline{I}_F)*re(\underline{I}_F)+im(\underline{Z}_{1Fd}*\underline{I}_F)*re(\underline{I}_F))$$

According to an embodiment of the invention, the variables are preferably selected as described earlier, but setting d=1.

If equations (eq15. . . eq16) cannot be applied because of insufficient network data and/or measurement data, then an initial value of s=0.5 could be used instead. This assumes that load is evenly distributed along the feeder. It must, however, be noticed that deviation from 'true' s value results in an error in fault distance estimation. Based on computer simulations and field tests, an X p.u. deviation in s results in an X p.u. error in a fault distance estimate. For example, if 'true' s=0.4, but 0.3 or 0.5 is used as parameter s value, then a ±0.1 p.u. error in the estimated fault distance is to be expected. If s is set smaller than true s, then the estimated fault distance becomes too small. If s is set larger than true s, then the estimated fault distance becomes too large. Note that s parameter affects only eq3a, eq3b and eq4 where fault is located behind the load.

Load variation could be handled with several setting groups and changing the value of s based on load monitoring and network configurations. This could be done automatically.

According to an embodiment of the invention, when two alternative estimates for fault distance d are obtained from equations eq3a, eq3b and eq8a, eq8b or eq4 and eq9, the correct result, d, is then selected based on the following criteria:

Using equations eq3a, eq3b and eq8a, eq8b (the correct root is first selected by requiring that 0<d<1 preferably with some error marginal):

If s<d_eq3<1, then d=d_eq3, else d=d_eq8 or alternatively

If 0<d_eq8<s, then d=d_eq8, else d=d_eq3 where d_eq3=the first estimate value for the distance between the measuring point and the point of fault obtained from equations eq3a and eq3b d_eq8=the second estimate value for the distance between the measuring point and the point of fault obtained from equations eq8a and eq8b.

Using equations eq4 and eq9:

If s<d_eq4<1, then d=d_eq4, else d=d_eq9 or alternatively

If 0<d_eq9<s, then d=d_eq9, else d=d_eq4 where d_eq4=the first estimate value for the distance between the measuring point and the point of fault obtained from equation eq4 d_eq9=the second estimate value for the distance between the measuring point and the point of fault obtained from equation eq9.

In case the fault distance is calculated on the basis of pre-fault and fault values of voltages and currents, the selection logic is typically applicable only when the earth fault current with zero fault resistance exceeds load current magnitude. Otherwise the selection logic might not operate reliably. The accuracy can be improved by increasing the fault current magnitude in relation to load current magnitude. This can be done e.g. with switching operations in the background network during dead-time of an auto-reclosing sequence.

In practice, there is always some fault resistance included in an earth fault and the fault current without fault resistance can be calculated with the following equation:

$$I_e = \frac{U \cdot I_{ef}}{\sqrt{U^2 - \left(I_{ef} \cdot \sqrt{3} \cdot R_F\right)^2}} \quad \text{eq17}$$

where $I_e$=magnitude of estimated earth fault current without fault resistance $I_{ef}$=magnitude of estimated earth fault current with fault resistance=abs($\underline{I}_F$*3)

U=magnitude of nominal phase-to-phase voltage $R_F$=Estimate for fault resistance from eq5 or eq10.

The ratio between pre-fault phase current and fault current from equation 17 can be calculated and used together with an estimate of fault resistance to judge the validity of estimated fault distance. Based on simulations and field tests, if the fault distance is calculated based on pre-fault and fault values of voltages and currents, the fault distance estimate is valid only when the fault current from eq17 exceeds the pre-fault phase current.

For a reliable fault location estimate, the following additional checks can be made:

Value of d is positive

Value of d is between 0 . . . 1 (with some error margin)

Value of d has a stabile behavior in time.

Estimated fault resistance is below a certain limit. Based on field tests, the maximum fault resistance that can be detected may be several kilo-ohms. Large fault resistance values, however, affect the fault distance estimate by reducing the estimate.

A system for determining a distance of a phase-to-earth fault on a three-phase electric line according to an embodiment of the invention may be implemented such that it comprises a detection unit which detects a fault on the electric line, an identification unit, which identifies a faulted phase or phases of the electric line, and a calculation unit which determines the distance between the measuring point and the point of fault as described above. Here the term 'unit' refers generally to a physical or logical entity, such as a physical device or a part thereof or a software routine. The other embodiments of the invention described above may be implemented e.g. with the calculation unit or one or more additional units. The above-mentioned detection, identification and calculation units and possible additional units may be physically separate units or implemented as one entity. One or more of these units may reside in the protective relay unit 40 of FIG. 1, for example.

When the fault detection and identification of the faulted phase are performed by a separate unit or units which are possibly already present in the system to be protected, the invention can be implemented with an apparatus which receives the fault detection information and indication of the faulted phase from such units. According to an embodiment of the invention, such an apparatus is configured to determine, in response to receiving an indication of a fault on the electric line and of a faulted phase or phases of the electric line, a distance of a phase-to-earth fault as described above. Such an apparatus may also be configured to implement the other embodiments of the invention described above.

The system and apparatus according to embodiments of the invention can be implemented by means of a computer or corresponding digital signal processing equipment with suitable software therein, for example. Such a computer or digital signal processing equipment preferably comprises at least a memory providing storage area used for arithmetical operations and a processor, such as a general-purpose digital signal processor (DSP), for executing the arithmetical operations. It is also possible to use a specific integrated circuit or circuits, or corresponding components and devices for implementing the functionality according to various embodiments of the invention.

The invention can be implemented in existing system elements, such as various protective relays or relay arrangements, or by using separate dedicated elements or devices in a centralized or distributed manner. Present protective devices for electric systems, such as protective relays, typically comprise processors and memory that can be utilized in the functions according to embodiments of the invention. Thus, all modifications and configurations required for implementing an embodiment of the invention e.g. in existing protective devices may be performed as software routines, which may be implemented as added or updated software routines. If the functionality of the invention is implemented by software, such software can be provided as a computer program product comprising computer program code which, when run on a computer, causes the computer or corresponding arrangement to perform the functionality according to the invention as described above. Such a computer program code can be stored on a computer readable medium, such as suitable memory means, e.g. a flash memory or a disc memory from which it is loadable to the unit or units executing the program code. In addition, such a computer program code implementing the invention can be loaded to the unit or units executing the computer program code via a suitable data network, for example, and it can replace or update a possibly existing program code.

It will be obvious to a person skilled in the art that, as the technology advances, the inventive concept can be implemented in various ways. The invention and its embodiments are not limited to the examples described above but may vary within the scope of the claims.

The invention claimed is:

1. A method for determining a distance of a phase-to-earth fault on a three-phase electric line of an electric network, the method comprising:

monitoring current and voltage quantities of the three-phase electric line at a measuring point;

detecting a phase-to-earth fault on the three-phase electric line and a faulted phase of the three-phase electric line;

determining a first estimate value for a distance between the measuring point and a point of fault on the basis of values of the monitored current and voltage quantities and a first equation which relates the current and voltage quantities to the distance and is based on a fault loop model of the electric line, in which model the load of the electric line is located between the measuring point and the point of fault;

determining a second estimate value for the distance between the measuring point and the point of fault on the basis of values of the monitored current and voltage quantities and a second equation which relates the current and voltage quantities to the distance and is based on a fault loop model of the electric line, in which model the point of fault is located between the measuring point and load of the electric line; and selecting according to predetermined criteria one of the determined two estimate values as the distance between the measuring point and the point of fault.

2. The method of claim 1, wherein the first equation is:

$$\underline{U}_0+\underline{U}_1+\underline{U}_2 = s \cdot \underline{Z}_{1Fd} \cdot \underline{I}_1 + (d-s) \cdot \underline{Z}_{1Fd} \cdot \underline{I}_F + s \cdot \underline{Z}_{2Fd} \cdot \underline{I}_2 + (d-s) \cdot \underline{Z}_{2Fd} \cdot \underline{I}_F + d \cdot \underline{Z}_{0Fd} \cdot (\underline{I}_0 + d \cdot \underline{I}_{0Fd}/2) + 3 \cdot \underline{Z}_F \cdot \underline{I}_F$$

where d=per unit fault distance from the measuring point to the fault point $\underline{U}_0$=Zero sequence component voltage measured at the measuring point $\underline{U}_1$=Positive sequence component voltage measured at the measuring point $\underline{U}_2$=Negative sequence component voltage measured at the measuring point $\underline{Z}_{1Fd}$=Positive sequence impedance of the electric line per phase $\underline{Z}_{2Fd}$=Negative sequence impedance of the electric line per phase $\underline{Z}_{0Fd}$=Zero sequence impedance of the electric line per phase $\underline{Z}_F$=Fault impedance $\underline{I}_1$=Positive sequence component current measured at the measuring point $\underline{I}_F$=Fault component current at the fault point $\underline{I}_2$=Negative sequence component current measured at the measuring point $\underline{I}_0$=Zero sequence component current measured at the measuring point $\underline{I}_{0Fd}$=Zero sequence component current of the electric line itself s =per unit distance of equivalent load.

3. The method of claim 2, wherein the second equation is:

$$\underline{U}_0+\underline{U}_1+\underline{U}_2 = d \cdot \underline{Z}_{1Fd} \cdot \underline{I}_1 + d \cdot \underline{Z}_{2Fd} \cdot \underline{I}_2 + d \cdot \underline{Z}_{0Fd} \cdot (\underline{I}_0 + d \cdot \underline{I}_{0Fd}/2) + 3 \cdot \underline{Z}_F \cdot \underline{I}_F$$

4. The method of claim 1, wherein the first equation is:

$$\underline{U}_0+\underline{U}_1+\underline{U}_2 = s \cdot \underline{Z}_{1Fd} \cdot \underline{I}_1 + (d-s) \cdot \underline{Z}_{1Fd} \cdot \underline{I}_F + s \cdot \underline{Z}_{2Fd} \cdot \underline{I}_2 + (d-s) \cdot \underline{Z}_{2Fd} \cdot \underline{I}_F + d \cdot \underline{Z}_{0Fd} \cdot (\underline{I}_0 + \underline{I}_{0Fd}/2) + 3 \cdot \underline{Z}_F \cdot \underline{I}_F$$

where d=per unit fault distance from the measuring point to the fault point $\underline{U}_0$=Zero sequence component voltage measured at the measuring point $\underline{U}_1$=Positive sequence component voltage measured at the measuring point $\underline{U}_2$=Negative sequence component voltage measured at the measuring point $\underline{Z}_{1Fd}$=Positive sequence impedance of the electric line per phase $\underline{Z}_{2Fd}$=Negative sequence impedance of the electric line per phase $\underline{Z}_{0Fd}$=Zero sequence impedance of the electric line per phase $\underline{Z}_F$=Fault impedance $\underline{I}_1$=Positive sequence component current measured at the measuring point $\underline{I}_F$=Fault component current at the fault point $\underline{I}_2$=Negative sequence component current measured at the measuring point $\underline{I}_0$=Zero sequence component current measured at the measuring point $\underline{I}_{0Fd}$=Zero sequence component current of the electric line itself s=per unit distance of equivalent load.

5. The method of claim 4, wherein the second equation is:

$$\underline{U}_0+\underline{U}_1+\underline{U}_2 = d\cdot\underline{Z}_{1Fd}\cdot\underline{I}_1 + d\cdot\underline{Z}_{2Fd}\cdot\underline{I}_2 + d\cdot\underline{Z}_{0Fd}\cdot(\underline{I}_0+\underline{I}_{0Fd}/2) + 3\cdot\underline{Z}_F\cdot\underline{I}_F$$

6. The method of claim 1, wherein the selection of one of the determined two estimate values as the distance d between the measuring point and the point of fault is performed according to the following criteria:

If s<de1<1, then d=de1, else d=de2 where de1=the first estimate value for the distance between the measuring point and the point of fault determined on the basis of the first equation de2=the second estimate value for the distance between the measuring point and the point of fault determined on the basis of the second equation s=per unit distance of equivalent load.

7. The method of claim 1, wherein the selection of one of the determined two estimate values as the distance d between the measuring point and the point of fault is performed according to the following criteria:

If 0<de2< s, then d=de2, else d=de1 where de1=the first estimate value for the distance between the measuring point and the point of fault determined on the basis of the first equation de2=the second estimate value for the distance between the measuring point and the point of fault determined on the basis of the second equation s=per unit distance of equivalent load.

8. A computer readable medium storing computer program instructions which when executed by a computer program with the instructions causes the computer to carry out the following steps;

monitoring current and voltage quantities of the three-phase electric line at a measuring point;

detecting a phase-to-earth fault on the three-phase electric line and a faulted phase of the three-phase electric line;

determining a first estimate value for a distance between the measuring point and a point of fault on the basis of values of the monitored current and voltage quantities and a first equation which relates the current and voltage quantities to the distance and is based on a fault loop model of the electric line, in which model the load of the electric line is located between the measuring point and the point of fault:

determining a second estimate value for the distance between the measuring point and the point of fault on the basis of values of the monitored current and voltage quantities and a second equation which relates the current and voltage quantities to the distance and is based on a fault loon model of the electric line, in which model the point of fault is located between the measuring point and load of the electric line; and selecting according to predetermined criteria one of the determined two estimate values as the distance between the measuring point and the point of fault.

9. A system for determining a distance of a phase-to-earth fault on a three-phase electric line of an electric network, the system comprising:

means for monitoring current and voltage quantities of the three-phase electric line at a measuring point;

means for detecting a phase-to-earth fault on the three-phase electric line;

means for identifying a faulted phase of the three-phase electric line;

means for determining a first estimate value for a distance between the measuring point and a point of fault on the basis of values of the monitored current and voltage quantities and a first equation which relates the current and voltage quantities to the distance and is based on a fault loop model of the electric line, in which model the load of the electric line is located between the measuring point and the point of fault;

means for determining a second estimate value for the distance between the measuring point and the point of fault on the basis of values of the monitored current and voltage quantities and a second equation which relates the current and voltage quantities to the distance and is based on a fault loop model of the electric line, in which model the point of fault is located between the measuring point and load of the electric line; and means for selecting, according to predetermined criteria, one of the determined two estimate values as the distance between the measuring point and the point of fault.

10. The system of claim 9, wherein the first equation is:

$$\underline{U}_0+\underline{U}_1+\underline{U}_2 = s\cdot\underline{Z}_{1Fd}\cdot\underline{I}_1 + (d-s)\cdot\underline{Z}_{1Fd}\cdot\underline{I}_F + s\cdot\underline{Z}_{2Fd}\cdot\underline{I}_2 + (d-s)\cdot\underline{Z}_{2Fd}\cdot\underline{I}_F + d\cdot\underline{Z}_{0Fd}\cdot(\underline{I}_0+d\cdot\underline{I}_{0Fd}/2) + 3\cdot\underline{Z}_F\cdot\underline{I}_F$$

where d=per unit fault distance from the measuring point to the fault point $\underline{U}_0$=Zero sequence component voltage measured at the measuring point $\underline{U}_1$=Positive sequence component voltage measured at the measuring point $\underline{U}_2$=Negative sequence component voltage measured at the measuring point $\underline{Z}_{1Fd}$=Positive sequence impedance of the electric line per phase $\underline{Z}_{2Fd}$=Negative sequence impedance of the electric line per phase $\underline{Z}_{0Fd}$=Zero sequence impedance of the electric line per phase $\underline{Z}_F$=Fault impedance $I_1$=Positive sequence component current measured at the measuring point $I_F$=Fault component current at the fault point $I_2$=Negative sequence component current measured at the measuring point $I_0$=Zero sequence component current measured at the measuring point $I_{0Fd}$=Zero sequence component current of the electric line itself s=per unit distance of equivalent load.

11. A system as claimed in claim 10, wherein in that the second equation is:

$$U_0+U_1+U_2=d \cdot Z_{1Fd} \cdot I_1+d \cdot Z_{2Fd} \cdot I_2+d \cdot Z_{0Fd} \cdot (I_0+d \cdot I_{0Fd}/2)+3 \cdot Z_F \cdot I_F$$

12. The system of claim 9, wherein the first equation is:

$$U_0+U_1+U_2=s \cdot Z_{1Fd} \cdot I_1+(d-s) \cdot Z_{1Fd} \cdot I_F+s \cdot Z_{2Fd} \cdot I_2+(d-s) \cdot Z_{2Fd} \cdot I_F+d \cdot Z_{0Fd} \cdot (I_0+I_{0Fd}/2)+3 \cdot Z_F \cdot I_F$$

where d=per unit fault distance from the measuring point to the fault point $U_0$=Zero sequence component voltage measured at the measuring point $U_1$=Positive sequence component voltage measured at the measuring point $U_2$=Negative sequence component voltage measured at the measuring point $Z_{1Fd}$=Positive sequence impedance of the electric line per phase $Z_{2Fd}$=Negative sequence impedance of the electric line per phase $Z_{0Fd}$=Zero sequence impedance of the electric line per phase $Z_F$=Fault impedance $I_1$=Positive sequence component current measured at the measuring point $I_F$=Fault component current at the fault point $I_2$=Negative sequence component current measured at the measuring point $I_0$=Zero sequence component current measured at the measuring point $I_{0Fd}$=Zero sequence component current of the electric line itself s=per unit distance of equivalent load.

13. The system of claim 12, wherein the second equation is:

$$U_0+U_1+U_2=d \cdot Z_{1Fd} \cdot I_1+d \cdot Z_{2Fd} \cdot I_2+d \cdot Z_{0Fd} \cdot (I_0+I_{0Fd}/2)+3 \cdot Z_F \cdot I_F$$

14. The system of claim 9, wherein the means for selecting selects one of the determined two estimate values as the distance d between the measuring point and the point of fault according to the following criteria:

If s<de1<1, then d=de1, else d=de2 where de1=the first estimate value for the distance between the measuring point and the point of fault determined on the basis of the first equation de2=the second estimate value for the distance between the measuring point and the point of fault determined on the basis of the second equation s=per unit distance of equivalent load.

15. The system of claim 9, wherein the means for selecting selects one of the determined two estimate values as the distance d between the measuring point and the point of fault according to the following criteria:

If 0<de2<s, then d=de2, else d=de1 where de1=the first estimate value for the distance between the measuring point and the point of fault determined on the basis of the first equation de2=the second estimate value for the distance between the measuring point and the point of fault determined on the basis of the second equation s=per unit distance of equivalent load.

16. An apparatus for determining a distance of a phase-to-earth fault on a three-phase electric line of an electric network, the apparatus comprising a processor to:

monitor current and voltage quantities of the three-phase electric line at a measuring point;

wherein the processor, in response to receiving an indication of a fault on the three-phase electric line and of a faulted phase of the three-phase electric line:

determines a first estimate value for a distance between the measuring point and a point of fault on the basis of values of the monitored current and voltage quantities and a first equation which relates the current and voltage quantities to the distance and is based on a fault loop model of the electric line, in which model the load of the electric line is located between the measuring point and the point of fault;

determines a second estimate value for the distance between the measuring point and the point of fault on the basis of values of the monitored current and voltage quantities and a second equation which relates the current and voltage quantities to the distance and is based on a fault loop model of the electric line, in which model the point of fault is located between the measuring point and load of the electric line; and selects, according to predetermined criteria, one of the determined two estimate values as the distance between the measuring point and the point of fault.

17. The apparatus of claim 16, wherein the first equation is:

$$U_0+U_1+U_2=s \cdot Z_{1Fd} \cdot I_1+(d-s) \cdot Z_{1Fd} \cdot I_F+s \cdot Z_{2Fd} \cdot I_2+(d-s) \cdot Z_{2Fd} \cdot I_F+d \cdot Z_{0Fd} \cdot (I_0+d \cdot I_{0Fd}/2)+3 \cdot Z_F \cdot I_F$$

where d=per unit fault distance from the measuring point to the fault point $U_0$=Zero sequence component voltage measured at the measuring point $U_1$=Positive sequence component voltage measured at the measuring point $U_2$=Negative sequence component voltage measured at the measuring point $Z_{1Fd}$=Positive sequence impedance of the electric line per phase $Z_{2Fd}$=Negative sequence impedance of the electric line per phase $Z_{0Fd}$=Zero sequence impedance of the electric line per phase $Z_F$=Fault impedance $I_1$=Positive sequence component current measured at the measuring point $I_F$=Fault component current at the fault point $I_2$=Negative sequence component current measured at the measuring point $\underline{I}_0$=Zero sequence component current measured at the measuring point $\underline{I}_{0Fd}$=Zero sequence component current of the electric line itself s=per unit distance of equivalent load.

18. The apparatus of claim 17, wherein the second equation is:

$$\underline{U}_0+\underline{U}_1+\underline{U}_2=d\cdot\underline{Z}_{1Fd}\cdot\underline{I}_1+d\cdot\underline{Z}_{2Fd}\cdot\underline{I}_2+d\cdot\underline{Z}_{0Fd}\cdot(\underline{I}_0+d\cdot\underline{I}_{0Fd}/2)+3\cdot\underline{Z}_F\cdot\underline{I}_F.$$

19. The apparatus of claim 16, wherein the first equation is:

$$\underline{U}_0+\underline{U}_1+\underline{U}_2=s\cdot\underline{Z}_{1Fd}\cdot\underline{I}_1+(d-s)\cdot\underline{Z}_{1Fd}\cdot\underline{I}_F+s\cdot\underline{Z}_{2Fd}\cdot\underline{I}_2+(d-s)\cdot\underline{Z}_{2Fd}\cdot\underline{I}_F+d\cdot\underline{Z}_{0Fd}\cdot(\underline{I}_0+\underline{I}_{0Fd}/2)+3\cdot\underline{Z}_F\cdot\underline{I}_F$$

where d=per unit fault distance from the measuring point to the fault point $\underline{U}_0$=Zero sequence component voltage measured at the measuring point $\underline{U}_1$=Positive sequence component voltage measured at the measuring point $\underline{U}_2$=Negative sequence component voltage measured at the measuring point $\underline{Z}_{1Fd}$=Positive sequence impedance of the electric line per phase $\underline{Z}_{2Fd}$=Negative sequence impedance of the electric line per phase $\underline{Z}_{0Fd}$=Zero sequence impedance of the electric line per phase $\underline{Z}_F$=Fault impedance $\underline{I}_1$=Positive sequence component current measured at the measuring point $\underline{I}_F$=Fault component current at the fault point $\underline{I}_2$=Negative sequence component current measured at the measuring point $\underline{I}_0$=Zero sequence component current measured at the measuring point $\underline{I}_{0Fd}$=Zero sequence component current of the electric line itself s=per unit distance of equivalent load.

20. The apparatus of claim 19, wherein the second equation is:

$$\underline{U}_0+\underline{U}_1+\underline{U}_2=d\cdot\underline{Z}_{1Fd}\cdot\underline{I}_1+d\cdot\underline{Z}_{2Fd}\cdot\underline{I}_2+d\cdot\underline{Z}_{0Fd}\cdot(\underline{I}_0+\underline{I}_{0Fd}/2)+3\cdot\underline{Z}_F\cdot\underline{I}_F.$$

21. The apparatus of claim 16, wherein the apparatus selects one of the determined two estimate values as the distance d between the measuring point and the point of fault according to the following criteria:

If S<de1<1, then d=de1, else d=de2 where de1=the first estimate value for the distance between the measuring point and the point of fault determined on the basis of the first equation de2=the second estimate value for the distance between the measuring point and the point of fault determined on the basis of the second equation s=per unit distance of equivalent load.

22. The apparatus of claim 16, wherein the apparatus selects one of the determined two estimate values as the distance d between the measuring point and the point of fault according to the following criteria:

If 0<de2<s, then d=de2, else d=de1 where de1=the first estimate value for the distance between the measuring point and the point of fault determined on the basis of the first equation de2=the second estimate value for the distance between the measuring point and the point of fault determined on the basis of the second equation s=per unit distance of equivalent load.

23. The apparatus of claim 16, wherein the apparatus is a protective relay.

* * * * *